United States Patent [19]
Kuthi et al.

[11] Patent Number: 6,106,663
[45] Date of Patent: Aug. 22, 2000

[54] SEMICONDUCTOR PROCESS CHAMBER ELECTRODE

[75] Inventors: Andras Kuthi, Thousand Oaks; Lumin Li, Santa Clara, both of Calif.

[73] Assignee: Lam Research Corporation, Fremont, Calif.

[21] Appl. No.: 09/100,268

[22] Filed: Jun. 19, 1998

[51] Int. Cl.[7] .............................. C23F 1/02; C23C 14/00; C23C 16/00
[52] U.S. Cl. ......................... 156/345; 118/50.1; 118/715
[58] Field of Search .............................. 156/345; 118/715, 118/50.1

[56] References Cited

U.S. PATENT DOCUMENTS

| | | | |
|---|---|---|---|
| 4,637,853 | 1/1987 | Bumble et al. | 156/345 |
| 4,854,263 | 8/1989 | Chang et al. | 118/715 |
| 5,074,456 | 12/1991 | Degner et al. | 228/121 |
| 5,534,751 | 7/1996 | Lenz et al. | 315/111.71 |
| 5,593,540 | 1/1997 | Tomita et al. | 156/643.1 |
| 5,849,641 | 12/1998 | Arnett et al. | 438/734 |

FOREIGN PATENT DOCUMENTS

| | | | |
|---|---|---|---|
| 0821395A3 | 3/1998 | European Pat. Off. | H01J 37/32 |
| 63-4617 | 1/1988 | Japan | H01L 21/304 |

*Primary Examiner*—Jill Warden
*Assistant Examiner*—Dwayne K Handy
*Attorney, Agent, or Firm*—Martine Penilla & Kim, LLP

[57] ABSTRACT

Disclosed is a system for processing a semiconductor wafer through plasma etching operations. The system has a process chamber that includes a support chuck for holding the semiconductor wafer and a pair of RF power sources. In another case, the system can be configured such that the electrode is grounded and the pair of RF frequencies are fed to the support chuck (bottom electrode). The system therefore includes an electrode that is positioned within the system and over the semiconductor wafer. The electrode has a center region, a first surface and a second surface. The first surface is configured to receive processing gases from a source that is external to the system and flow the processing gases into the center region. The second surface has a plurality of gas feed holes that are continuously coupled to a corresponding plurality of electrode openings that have electrode opening diameters that are greater than gas feed hole diameters of the plurality of gas feed holes. The plurality of electrode openings are configured to define an electrode surface that is defined over a wafer surface of the semiconductor wafer. The electrode surface assists in increasing an electrode plasma sheath area in order to cause a shift in bias voltage onto the wafer surface, thereby increasing the ion bombardment energy over the wafer without increasing the plasma density.

19 Claims, 9 Drawing Sheets

SEMICONDUCTOR PROCESS CHAMBER ELECTRODE

BACKGROUND OF THE INVENTION

1. Field of the Invention

The present invention relates to semiconductor fabrication equipment, and more particularly, the present invention relates to improved semiconductor processing chamber electrodes and methods for making and implementing the improved electrodes.

2. Description of the Related Art

In semiconductor fabrication, integrated circuit devices are fabricated from semiconductor wafers that are placed through numerous processing operations. Many of the numerous processing operations are commonly carried out in processing chambers in which layers, such as, dielectric and metallization materials are successively applied and patterned to form multi-layered structures. For example, some of these layers (e.g., $SiO_2$) are commonly deposited in chemical vapor deposition (CVD) chambers, and then photoresist materials are spin-coated and placed through photolithography patterning. When a photoresist mask is defined over a particular surface, the semiconductor wafer is placed into a plasma etching chamber in order to remove (i.e., etch) portions of the underlying materials that are not covered by the photoresist mask.

FIG. 1A shows a semiconductor processing system 100 including a chamber 102 that is used for processing semiconductor wafers through etching operations. In this example, the chamber 102 includes a chuck 104 which is configured to support a semiconductor wafer 106. The chuck 104 also supports a plurality of quartz rings 108. Over a topmost quartz ring 108, sits a ceramic ring holder 110, which is configured to hold a top electrode 114. The top electrode 114 is configured to receive processing gases which will be distributed into the plasma region 112 during processing.

The top electrode is also shown coupled to a match box and diplexer 116a and an RF power source 118a. The chuck 104 is also coupled to a match box and diplexer 116b and an RF power source 118b. The chamber 102 is provided with outlets 120 which are configured to pump out excess gases from within the chamber during processing. In operation, the RF power supply 118a is configured to bias the top electrode 114 and operate at frequencies of about 27 MHz. The RF power source 118a is primarily responsible for generating most of the plasma density within the plasma region 112, while the RF power source 118b is primarily responsible for generating a bias voltage within the plasma region 112. The RF power source 118b generally operates at lower frequencies in the range of about 2 MHz.

FIG. 1B provides a more detailed view of the top electrode 114 of the semiconductor processing system 100. The top electrode 114 generally includes a number of gas buffer plates 122 which have a plurality of holes defined throughout their surface region, and are configured to evenly distribute the processing gases throughout the top electrode 114. In this manner, the gas buffer plates 112 will ensure that an about equal amount of gas is allowed to flow out of each of the gas feed holes 128 of a silicon plate 126. The top electrode 114 also has a graphite ring 124 which is configured to mount onto the ceramic holders 110 of FIG. 1A. Once the process gases are allowed to flow out of the gas feed holes 128, a plasma may be generated in the plasma region 112 that is defined between the surface of the silicon plate 126 and a surface of the wafer 106.

During operation, the RF power 118a and the RF power 118b is applied to the top electrode 114 and the chuck 104, respectively. Once the process gases are channeled into the top electrode 114 and allowed to flow out of the gas feed holes 128 into the plasma region 112, a plasma sheath 131 and 132 will be defined within the plasma region 112 as shown in FIG. 1C.

As pictorially shown, the silicon plate 126 will have an electrode surface 134 which is directly opposite a wafer surface 136 of the semiconductor wafer 106. As is well understood in plasma physics, the electrode surface 134 and the wafer surface 136 are partially responsible for producing the plasma sheaths 131 and 132 within the plasma region 112.

Specifically, as shown in FIG. 1D, plasma sheaths edges are defined at points 133a and 133b along a plasma density profile 133. The plasma density profile illustrates that the plasma concentration falls to about zero near the wafer surface 136 and the top electrode surface 134. As such, the plasma concentration gradually increases from zero up to a constant concentration between points 133a and 133b. The electrode surface 134 and the wafer surface 136 will therefore ensure that the bulk of the plasma is contained between the plasma sheaths 131 and 132 as shown in FIG. 1C.

As the demand to etch smaller and smaller integrated circuit device patterns continues to increase, more difficult high aspect ratio etching will be needed. As shown in FIG. 1E, a cross sectional view 140 of a wafer substrate 106' is shown. The wafer substrate 106' has a dielectric layer 140 deposited thereon and a patterned photoresist layer 142. The photoresist layer 142 has a patterned window 144 defining a window down to the dielectric layer 140. As the aspect ratios continue to increase (i.e., deeper and narrower etching geometries), a process window that defines a set of controllable process parameters will also rapidly shrink. When the process window shrinks, adjustment of process parameters will no longer improve etch rates, etch selectivities, or etch profiles.

Typically, the process parameters include pressure settings, flow rates, electrode biasing powers, types of processing chemistries, and so on. However, as aspect ratios continue to increase, varying the process window parameters no longer assist a processing chamber's ability to control a desired etching operation. For example, when a geometry such as that defined by the patterned window 144 (i.e., for a contact via or the like) in the photoresist layer 142 is desired, the best etching chemistries may no longer be able to etch all the way down through the dielectric layer 140. When that happens, a premature etch stop 146 will develop because the processing chemistries will also be depositing polymers on the sidewalls and the bottom during the etching operation. As is well known, this polymer deposition can seriously retard the etching of dielectric layers 140 when high aspect ratio patterns are the subject of etching.

In efforts to combat this problem, process engineers have in the past, attempted to increase the level of oxygen within the processing chamber during an etch operation. Unfortunately, when the oxygen level is increased within the processing chamber, the etching operation will produce a bow-shaped etch 148 within the dielectric layer 140. As can be appreciated, when such a bow-shaped etch 148 occur within the dielectric layer 140, subsequent filling of the via hole defined by the bow-shaped etch 148 will be problematic. That is, conventional conductive fill techniques used to deposit metallization within a via hole may not work because of the bow-shaped etch via 148. As a result, a fabricated device having the bow-shaped etch via holes 148 may fail to function within its intended design.

Another solution attempted in the prior art has been to increase the bias power of the RF power source 118b that is coupled to the chuck 104 in an attempt to increase the ion bombardment energy over the surface of the wafer 106. However, when the bias voltage of the RF power source 118b is increased, more plasma is also generated within the plasma region 114, which counteracts the increase in ion bombardment energy. In addition, the processing molecules channeled into the plasma region 112 may change their chemical composition when the bias power is increased, and therefore, may fail to perform the desired etching. Consequently, it has been observed that merely increasing the RF power that is applied to the chuck 104 does not help in improving the etching of high aspect ratio geometries.

In view of the foregoing, what is needed is a processing apparatus and method for making and implementing the apparatus which will assist in increasing the ion bombardment energy at the surface of a wafer without also increasing the plasma density or changing the chemical composition of the processing molecules.

SUMMARY OF THE INVENTION

The present invention fills these needs by providing a semiconductor processing chamber electrode that assists in shifting an increased ion bombardment energy toward the surface of the semiconductor wafer. It should be appreciated that the present invention can be implemented in numerous ways, including as a process, an apparatus, a system, a device, and a method. Several inventive embodiments of the present invention are described below.

In one embodiment, a system for processing a semiconductor wafer through plasma etching operations is disclosed. The system has a process chamber that includes a support chuck for holding the semiconductor wafer and a pair of RF power sources. The system further includes an electrode that is positioned within the system and over the semiconductor wafer. The electrode has a center region, a first surface and a second surface. The first surface is configured to receive processing gases from a source that is external to the system and flow the processing gases into the center region. The second surface has a plurality of gas feed holes that are continuously coupled to a corresponding plurality of electrode openings that have electrode opening diameters that are greater than gas feed hole diameters of the plurality of gas feed holes. The plurality of electrode openings are configured to define an electrode surface that is defined over a wafer surface of the semiconductor wafer. The electrode surface assists in increasing an electrode plasma sheath area in order to cause a shift in bias voltage onto the wafer surface, thereby increasing the ion bombardment energy over the wafer without increasing the plasma density.

In another embodiment, a method for making a top electrode that is positioned in a chamber for processing a semiconductor wafer through plasma etching operations is disclosed. The chamber includes a support chuck for holding the semiconductor wafer and a pair of RF power sources. The method includes forming the top electrode to have a center region, a first surface and a second surface. The first surface has an inlet that is configured to receive processing gases from a source that is external to the system and flow the processing gases into the center region. The second surface has a plurality of gas feed holes that lead to a plurality of electrode openings that have electrode opening diameters that are greater than gas feed hole diameters of the plurality of gas feed holes. The plurality of electrode openings are configured to define an electrode surface that is defined over a wafer surface of the semiconductor wafer.

In yet another embodiment, a plasma process chamber for processing a semiconductor wafer is disclosed. The plasma process chamber includes a support chuck for holding the semiconductor wafer and a pair of RF power sources. The plasma process chamber includes an electrode means for providing gas chemistries into a process region that is defined between the electrode means and a wafer surface of the semiconductor wafer. The electrode means has a plurality of oversized gas feed holes that are configured to define an electrode surface over the wafer surface. When a plasma is generated between the electrode surface and the wafer surface in the plasma process chamber, a substantially planar first plasma sheath is defined over the wafer surface and a contoured second plasma sheath is defined over the electrode surface. The contoured second plasma sheath is configured to extend into the plurality of oversized gas feed holes, and therefore the contoured second plasma sheath has a greater surface area than the substantially planar first plasma sheath. The greater surface area therefore causes an increased bias voltage over the wafer surface and a decreased bias voltage over the electrode surface.

Advantageously, it is now possible to increase the bias voltage over the surface of the wafer without also causing an increase in plasma density. Because an increased bias voltage is essentially an increase in ion bombardment energy, higher aspect ratio geometries can now be etched without causing premature etch stops or bow etch profiles. These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings.

DETAILED DESCRIPTION OF THE PREFERRED EMBODIMENTS

An invention is described for a semiconductor processing chamber electrode that assists in shifting an increased plasma ion bombardment energy toward the surface of the semiconductor wafer to improve etching of high aspect ratio geometries. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

As described above, the present invention discloses a unique top electrode that enables processing chambers to retain control of processing windows during high aspect ratio etching operations. Although the top electrodes of the present invention can be implemented into many different types of processing chambers, one exemplary chamber that will benefit from the inventive design features of the disclosed top electrodes is a Lam Research Rainbow 4520XL processing chamber, which is available from Lam Research Corporation of Fremont, Calif. In some chamber orientations, the top electrode may be grounded and both frequencies are fed to the bottom electrode (i.e., wafer support chuck). In either case, the top electrode configuration of the present invention will assist in increasing the ion bombardment energy on the surface of the wafer without the side effects of the prior art.

Figure 1A:
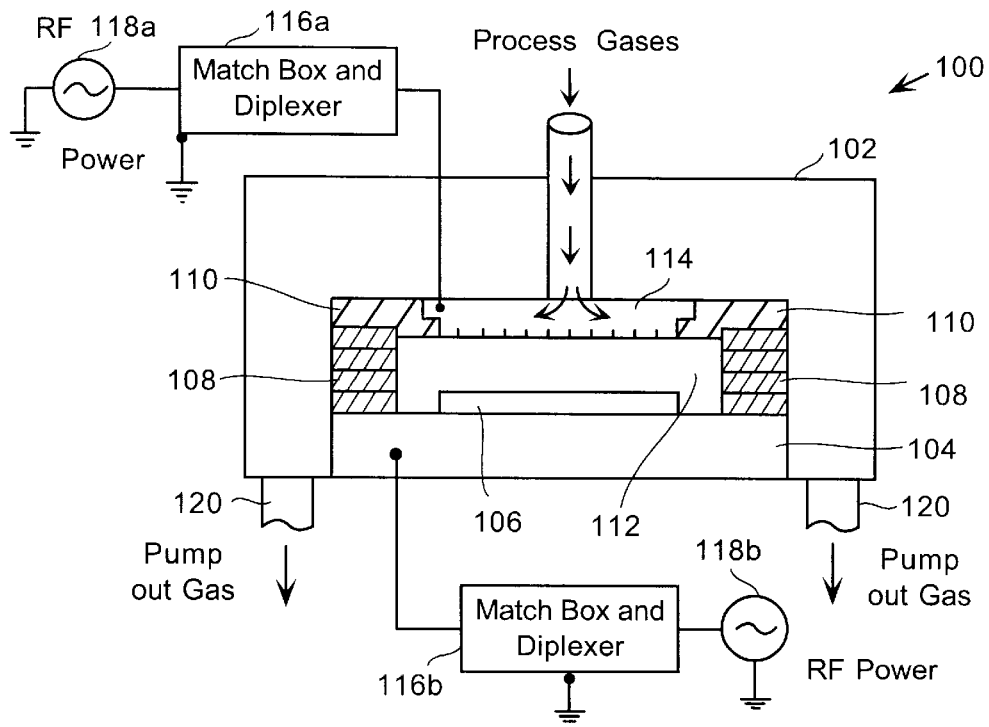
FIG. 1A shows a semiconductor processing system including a chamber that is used for processing semiconductor wafers through etching operations.
Figure 1B:
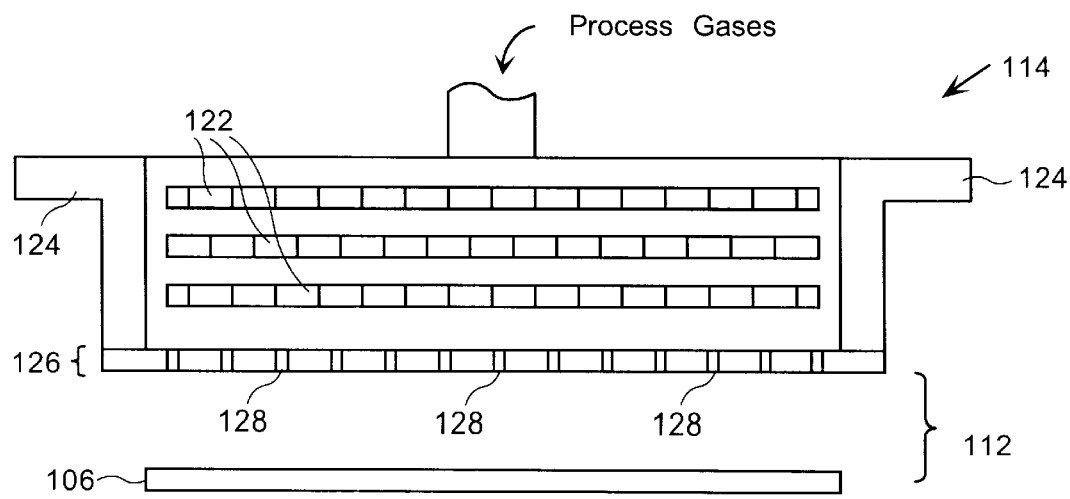
FIG. 1B provides a more detailed view of a top electrode of a semiconductor processing system.
Figure 2A:
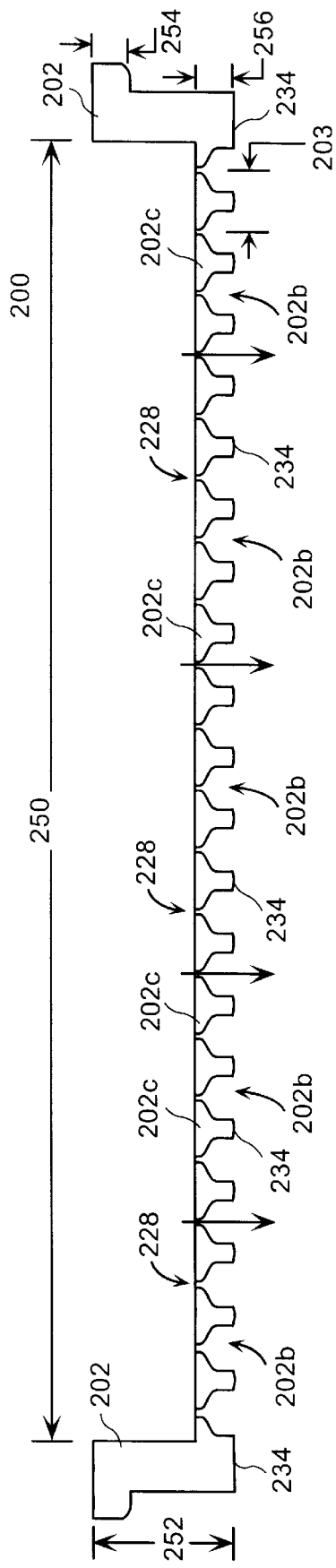
FIG. 2A shows a cross sectional view of a top electrode in accordance with one embodiment of the present invention.

FIG. 2A shows a cross sectional view of a top electrode 200 in accordance with one embodiment of the present invention. In this embodiment, the top electrode 200 includes an electrode body 202 that has a plurality of electrode regions 202c that define respective electrode openings 202b. The electrode openings 202b form a channel that leads to a plurality of gas feed holes 228. In general, the gas feed holes 228 channel the processing gases to a plasma region 112, as described with respect to FIG. 1A. Accordingly, when the top electrode 200 is inserted into a semiconductor processing system chamber, a surface 234 of the electrode body 202 will define the surface that is in close proximity to a generated plasma sheath.

In a preferred embodiment of the present invention, the inter-portion of the electrode body 202 will preferably have an opening 250 which is about the same diameter of a wafer being processed. For example, when an 8-inch wafer is being processed, the diameter 250 is preferably sized to be about 8 inches. Although not shown, gas buffer plates are typically positioned within the electrode body 202. The electrode body 202 has a preferred thickness 252 of about 1 inch, while the electrode regions 202c have a thickness 256 that is about ¼ inch. Of course, these exemplary dimensions may be modified depending on the size of the semiconductor wafer being processed.

Figure 2B:
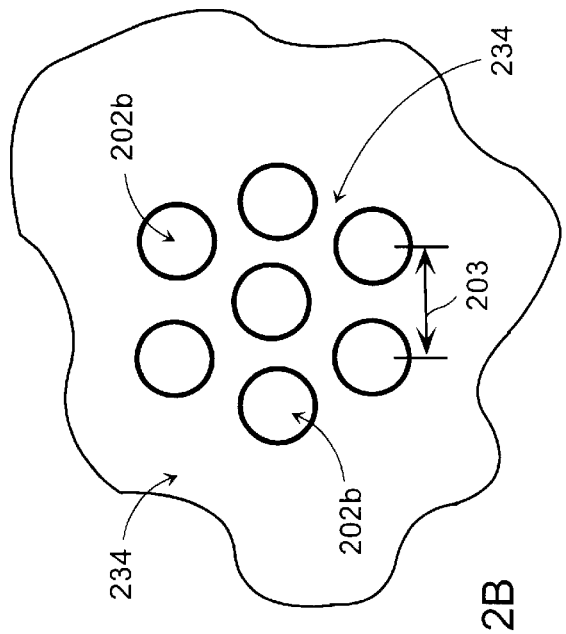
FIG. 2B shows a plan view of a surface of the electrode body in accordance with one embodiment of the present invention.

FIG. 2B shows a plan view of the surface 234 of the electrode body 202 in accordance with one embodiment of the present invention. As shown, the electrode openings 202b are preferably arranged throughout the surface 234 in a hexagonal pattern arrangement. In this hexagonal pattern arrangement, the separation 203 between the electrode openings 202b is preferably set to about 0.375 inches. Also, in a preferred embodiment, the diameter of each of the electrode openings 202b is set to be about 0.25 inches.

Figure 2C:
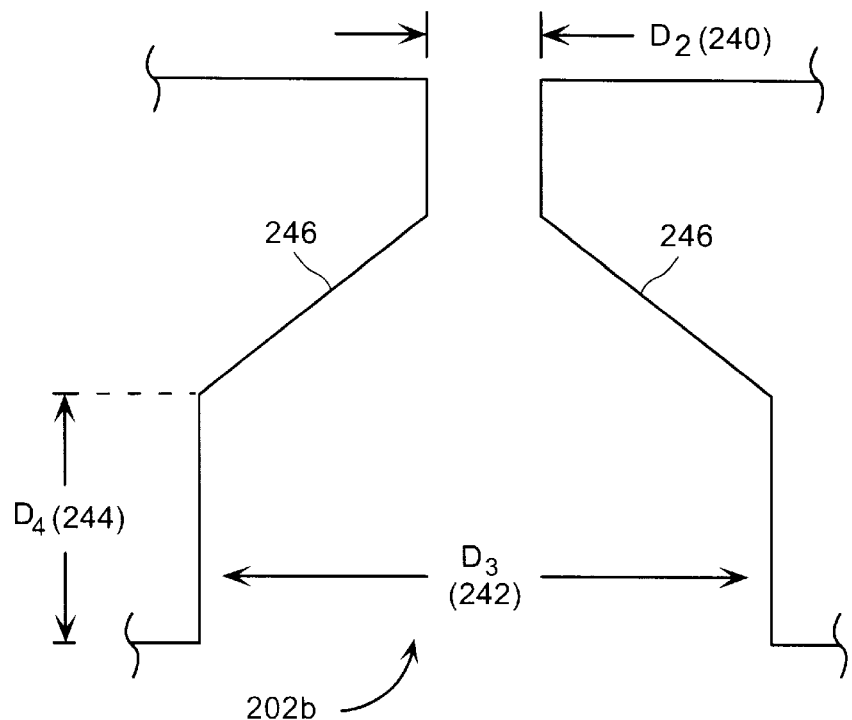
FIG. 2C shows a more detailed view of the electrode opening of FIG. 2A in accordance with one embodiment of the present invention.
Figure 2D:
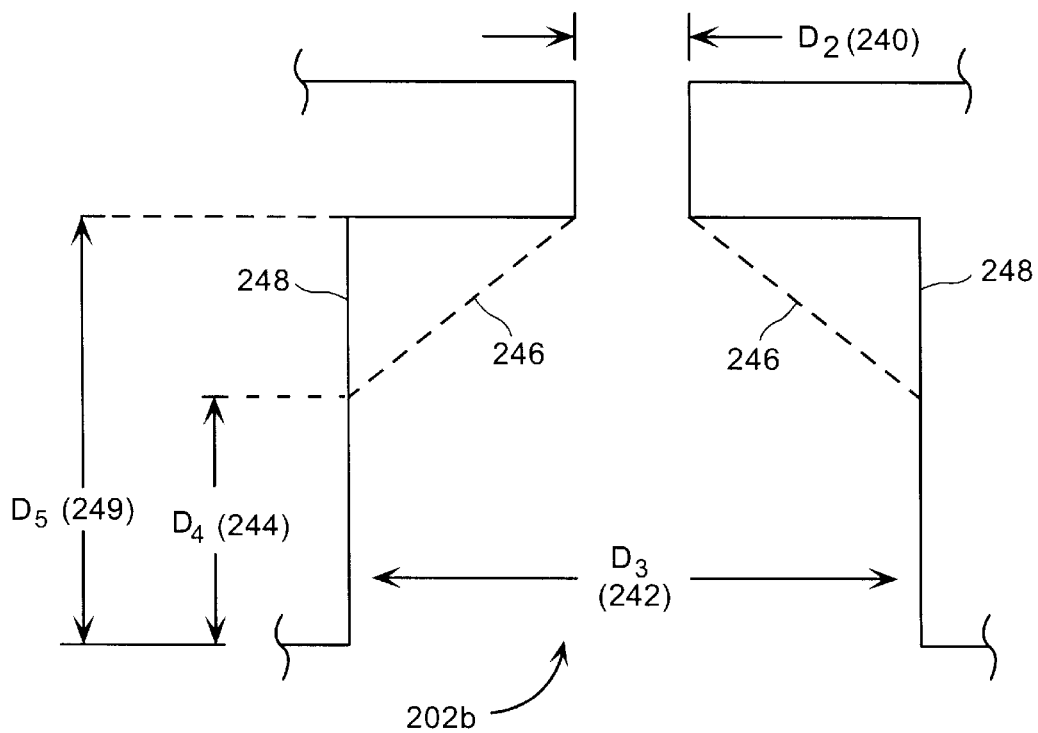
FIG. 2D shows an alternative detailed view of an electrode opening in accordance with one embodiment of the present invention.

FIG. 2C shows a more detailed view of the electrode opening 202b of FIG. 2A in accordance with one embodiment of the present invention. The electrode opening 202b has a diameter $D_3$ 242 that is selected to be at least equal to or greater than about 5 $\Lambda_{Debye}$ (i.e., $\geq 0.5$ mm). The depth $D_4$ 244 of the electrode opening 202b is preferably set to be between about ¹⁄₃₂ inch and about ¼ inch, and more preferably between about ¹⁄₁₆ inch and about ¼ inch, and most preferably about ⅛ inch. Preferably, the diameter $D_2$ 240 is about 0.1 mm. In this embodiment, the electrode opening 202b has an angled (about 30 degrees) surface 246, which is caused by the profile of a machining drill bit. However, it should be understood that other angles will work as well. For example, FIG. 2D shows a case in which the angled surface 246 is replaced with a right angle 248. Of course, when the angled surface 246 is removed, the electrode opening 202b may extend to a distance $D_5$ 249, which may be greater than distance $D_4$ 244.

Figure 2E:
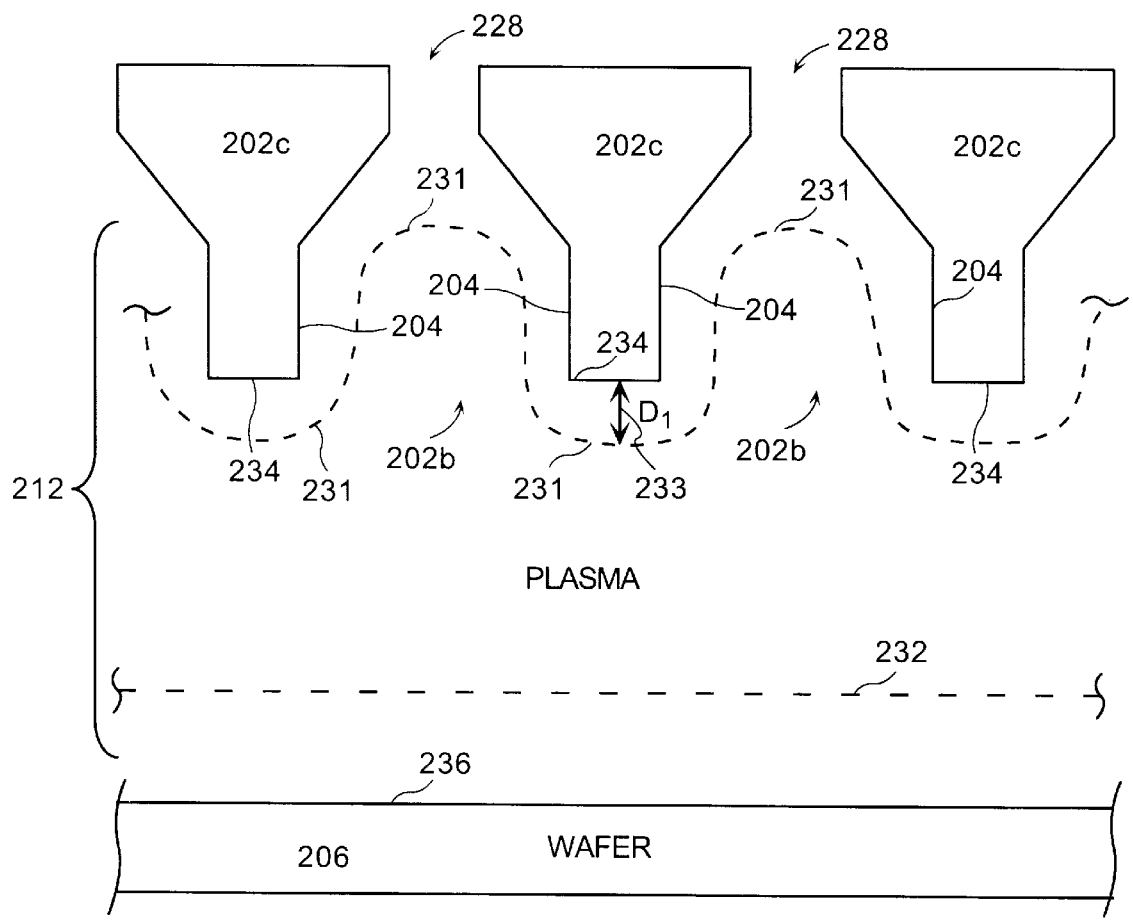
FIG. 2E shows a more detailed view of the electrode opening surfaces, a wafer surface, and a corresponding plasma having plasma sheaths in accordance with one embodiment of the present invention.

FIG. 2E shows a cross sectional view of three electrode regions 202c and a cross section of the wafer 206 in accordance with one embodiment of the present invention. In a preferred embodiment, the distance between the surface 234 and the wafer surface 236 is preferably set to be between about 0.75 cm and about 4 cm, and more preferably between about 1 cm and about 3 cm, and most preferably about 2 cm. Once the semiconductor processing system is placed into its operational state (i.e., processing gases have been flown into the chamber, biasing powers have been set, pressures and temperatures adjusted, etc.), a plasma is generated within a plasma region 212. Because the electrode openings 202b have been increased to be at least equal to or greater than about 0.5 mm, a plasma sheath 231 is caused to shift into the electrode openings 202b.

Figure 1C:
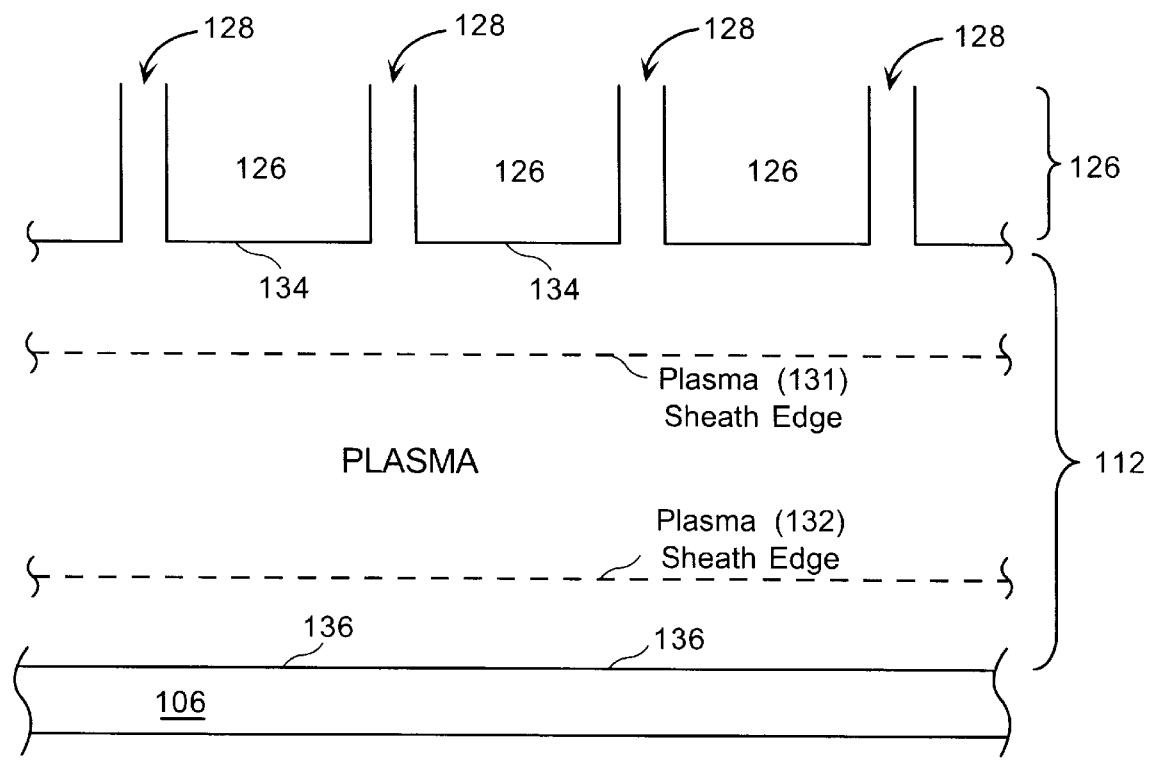
FIG. 1C shows a plasma and plasma sheaths formed next to an electrode surface and a wafer surface.
Figure 1D:
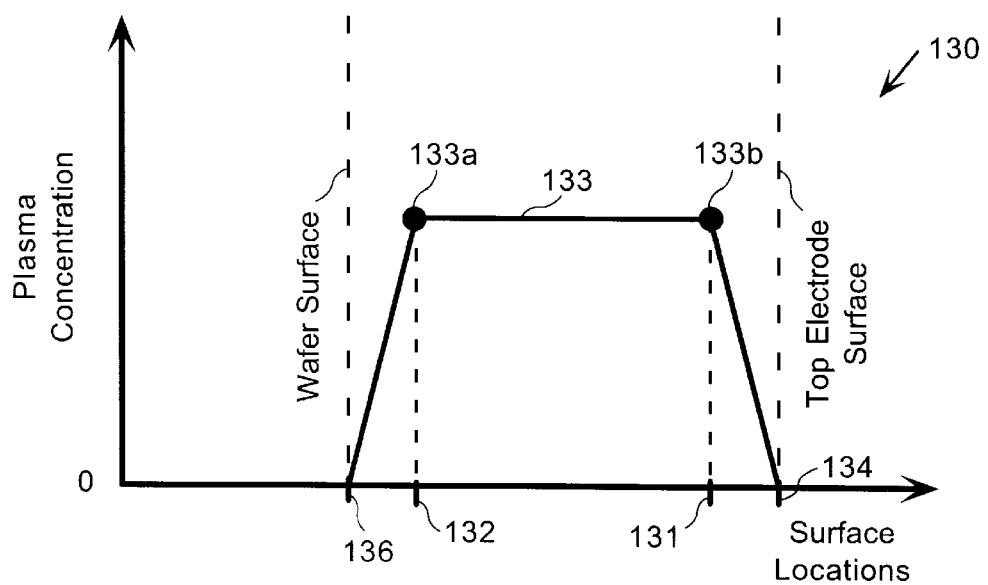
FIG. 1D shows a plasma concentration profile and the plasma sheath locations relative to an electrode surface and a wafer surface.
Figure 1E:
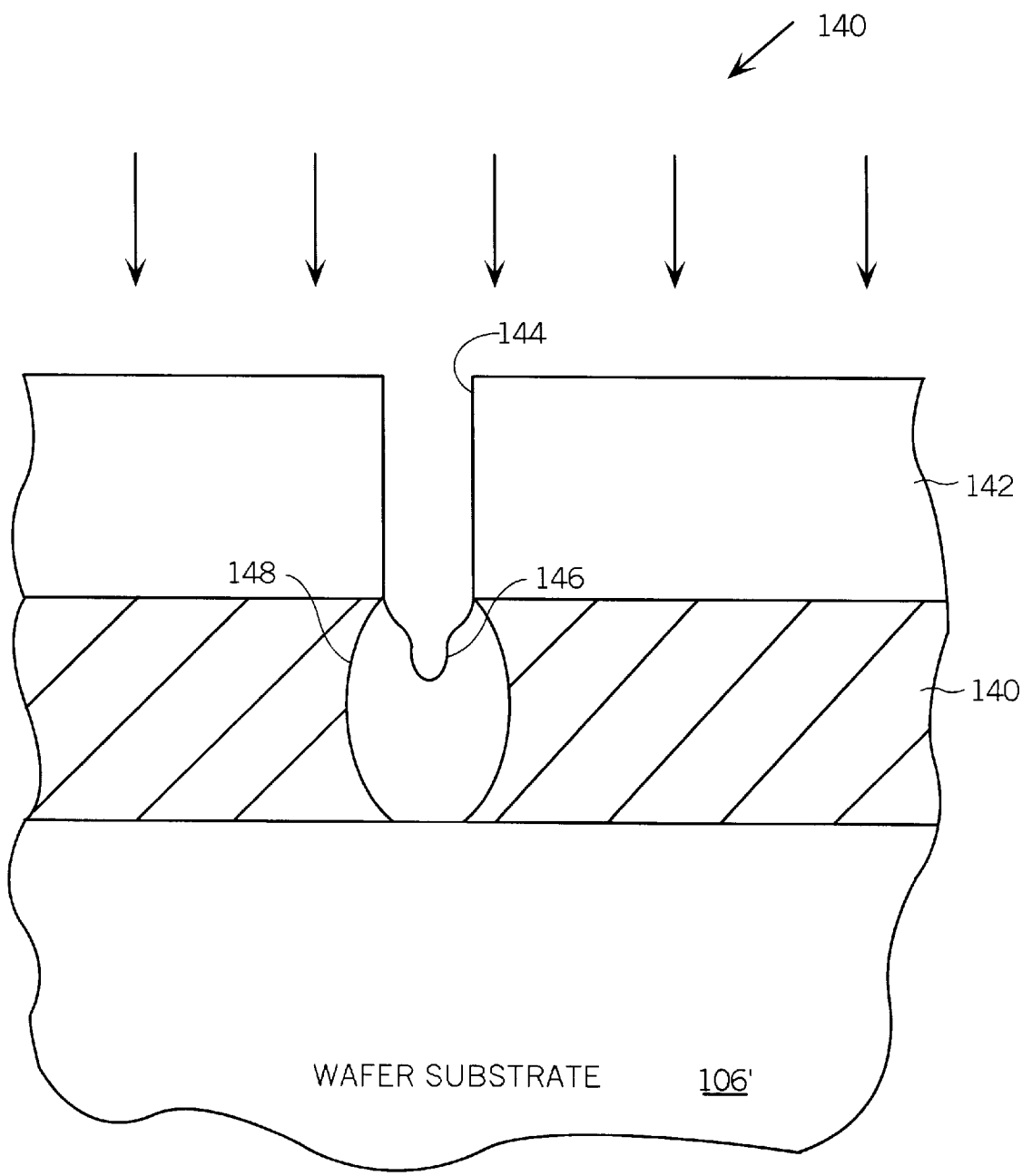
FIG. 1E shows a cross sectional view of a semiconductor substrate undergoing an etch operation.

As pictorially shown, the shifted plasma sheath 231 follows the profile of the electrode opening 202b walls. That is, the plasma sheath 231 is seperated from the surface 234 and electrode opening surface 204 by a distance $D_1$ 233. In one embodiment, the distance $D_1$ 233 may be between about 0.5 mm, and about 5 mm, and most preferably about 2 mm. Because the plasma sheath next to the top electrode in prior art designs is not shifted as shown in FIG. 1C, the surface area of both plasma sheaths will be about equal. However, because the plasma sheath 231 is shifted into the electrode openings 202b throughout the top electrode 200, the surface area of the plasma sheath 231 will be greater than the surface area of the plasma sheath 232.

Figure 3:
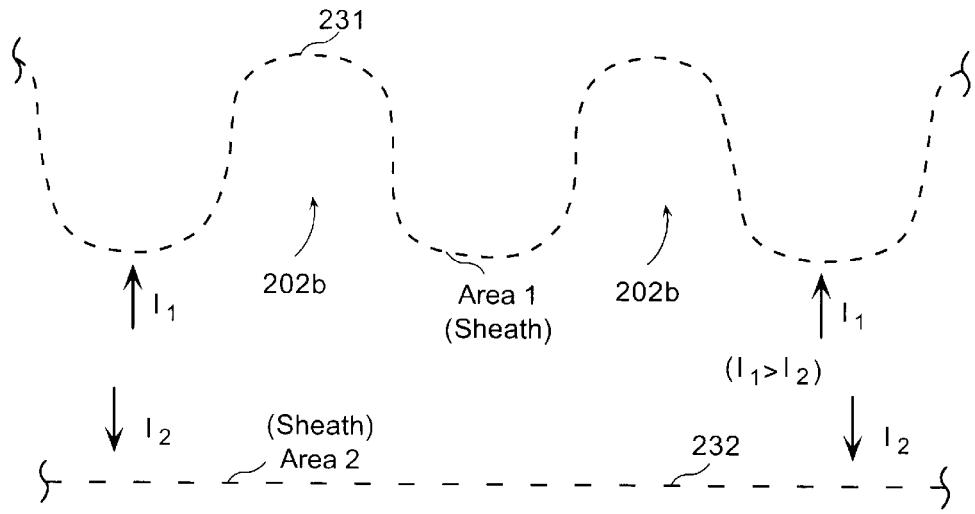
FIG. 3 shows a more detailed view of a contoured plasma sheath that is defined into the electrode openings and a substantially planar plasma sheath that is defined over the wafer surface in accordance with one embodiment of the present invention.

FIG. 3 shows a cross sectional view of the plasma sheath 231 that conforms to the surfaces of the electrode regions 202c as shown in FIG. 2E, and the plasma sheath 232 that is defined above the wafer 206. Although only a cross sectional view of the sheaths 231 and 232 are shown, it should be understood that the sheaths are actually three-dimensional (3D) blankets that are defined over each of the surfaces of the top electrode 200 and the wafer 206. As such, a substantial increase in sheath area$_1$ is produced when the sheath 231 shifts into the electrode openings 202b. Table A below shows an exemplary calculation of the increase in sheath 231 surface area$_1$ compared to the sheath 232 surface area$_2$. Of course, other area increases may be obtained depending on the specific electrode opening geometries.

TABLE A

TOP ELECTRODE AREA INCREASE

| Electrode Opening 202b | diameter (d = ¼ in) | depth (h = ⅛ in) |
|---|---|---|
| Distance Between Electrode Openings | D = ⅜ in | |
| Transparency | T = (d$^2$π/D$^2$√3) | T = 0.806 |
| Added Area | A = (dπh) + ((1/cos(30 deg)) − 1)d$^2$π/4 | A = 0.682 cm$^2$ |
| Base Area | B = ((D$^2$√3)/4) | B = 0.393 cm$^2$ |
| Area Increase | I = (B + A)/B | I = 2.7 |

As shown from the calculations of Table A, the surface area$_1$ of the plasma sheath 231 has increased to about 2.7 times the area$_2$ of the sheath 232 that is defined over the wafer 206. In other preferred embodiments, the increase in area can be between about 1.5 and 3.5, and most preferably between about 2 and about 3.

Figure 4A:
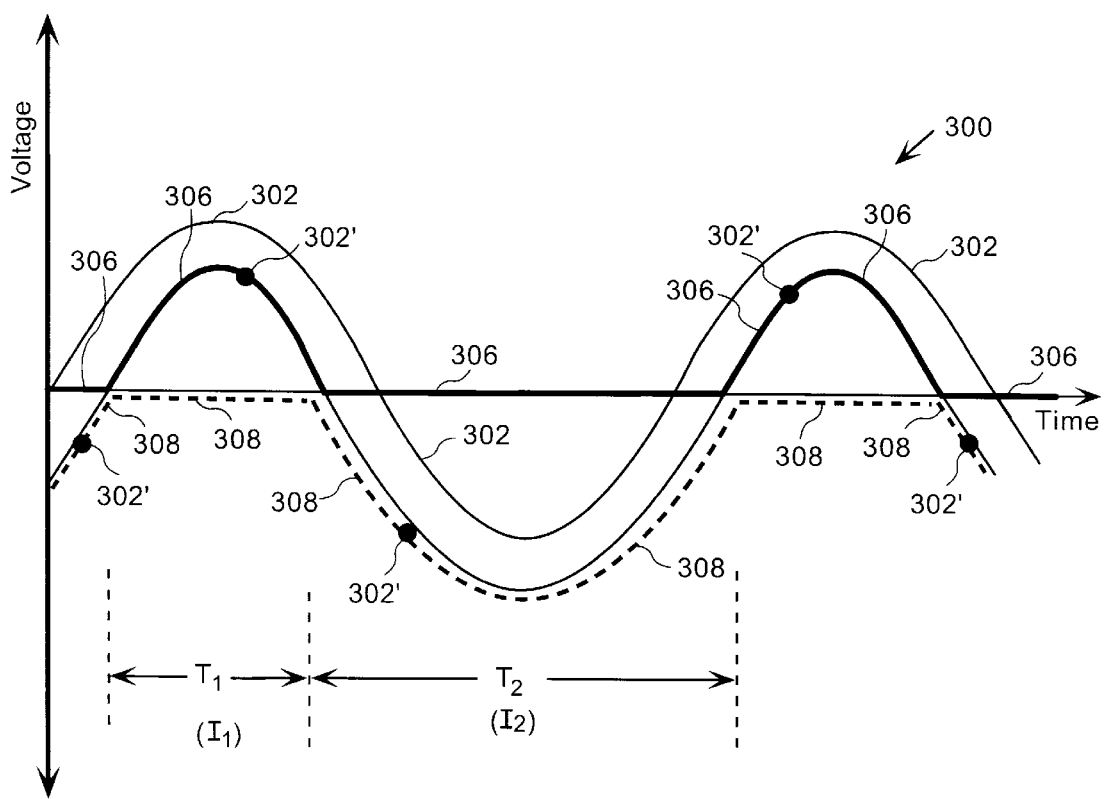
FIG. 4A shows voltage waveforms plotted over time, including a shifted voltage waveform that causes a shift in bias voltage in accordance with one embodiment of the present invention.

FIG. 4A shows a graph 300 depicting sinusoidal RF voltage waveforms over time in accordance with one embodiment of the present invention. In this example, a sinusoidal voltage wave 302 of a prior art design having equal area sheaths (i.e., area$_1$=area$_2$) is shown. When the area sheaths are equal, the sinusoidal voltage wave 302 will be positive for an equal amount of time as it is negative. However, once the electrode 200 is placed into the processing chamber, the area$_1$ of the sheath 231 will increase as shown in FIG. 3. At this point, the magnitude of current (ion and electron current) flowing through the plasma will be different during the time that a current I$_1$ flows away from the wafer 206 in the direction of the top electrode 200 and during the time that a current I$_2$ flows away from the top electrode 200 in the direction of the wafer 206. In fact, because there is a greater sheath surface area$_1$ close to the top electrode surface 234/204, the current I$_1$ will have a greater magnitude than the current I$_2$ as depicted in FIG. 3.

Figure 4B:
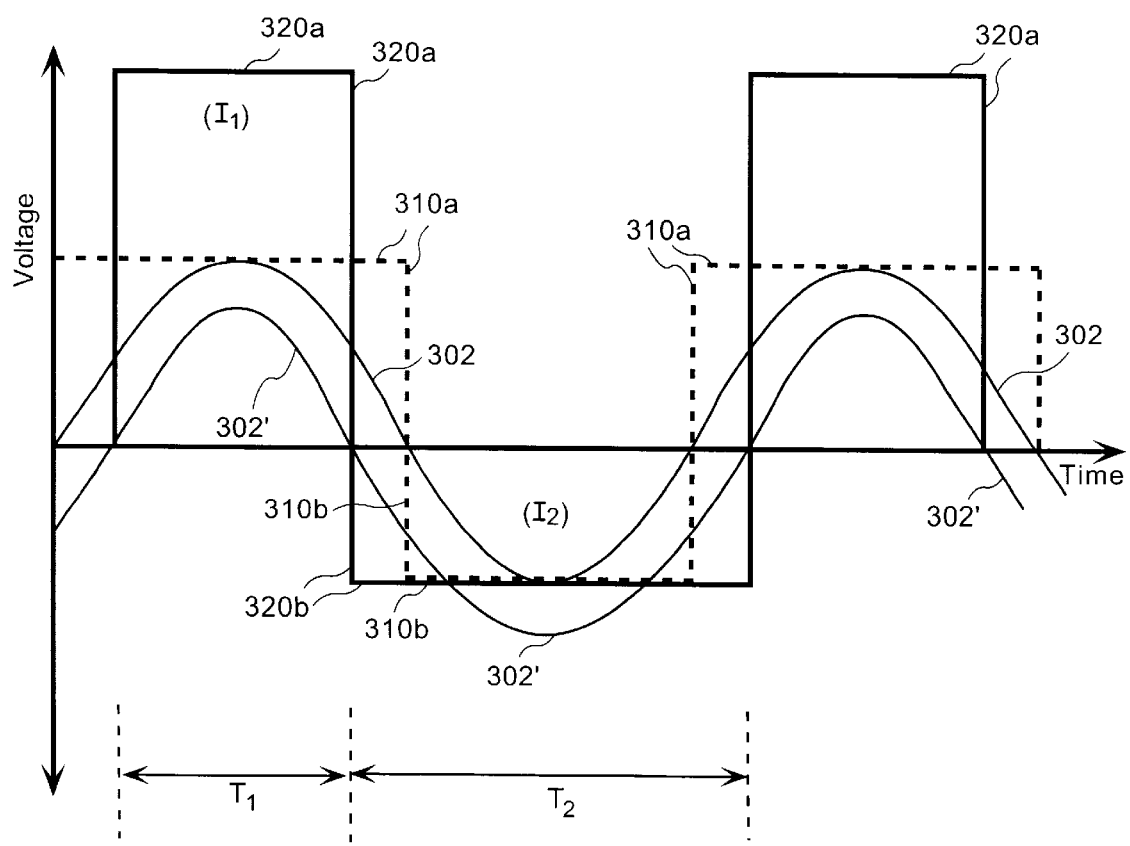
FIG. 4B shows a graph illustrating the resulting current magnitudes over a cycle of a shifted voltage waveform of FIG. 4A in accordance with one embodiment of the present invention.

Because of this current magnitude difference, the sinusoidal voltage wave 302 will shift downward to form a shifted sinusoidal voltage wave 302'. At this point, it should be evident that the shifted sinusoidal voltage wave 302' will be positive for a shorter amount of time T$_1$ than it is negative T$_2$. However, over a full cycle, the current flowing in one direction (i.e., I$_1$) across the plasma has to be the same as the current flowing in the other direction (i.e., I$_2$). FIG. 4B illustrates how a total current during time T$_1$ for the larger magnitude current I$_1$ will actually equal a total current during a time T$_2$ for a smaller magnitude current I$_2$. Specifically, the area under 320a defines the net current for I$_1$ and the area under 320b defines the net current for I$_2$. For reference purposes only, the net current under area 310a and 310b are also equal to each other in a non-shifted system.

Referring back to FIG. 4A, a wave portion 306 is the result of a half-wave rectification that is induced by the generated plasma. When a time average is taken over one cycle of the wave portion 306, a bias voltage on the surface of the top electrode is produced. In a like manner, a wave portion 308 is the result of another half-wave rectification that was induced by the generated plasma. Upon taking a time average over one cycle of the wave portion 308, a bias voltage on the surface of the wafer is produced. It is important to note that the bias voltage produced on the surface of the wafer 206 has substantially increased over the standard bias voltage. That is, in prior art systems, the applied bias voltage is generally equally applied to both the surface of the top electrode and the surface of the wafer. Thus, by increasing the surface area of the sheath 231 that is proximate to the top electrode 200 surface, it is possible to increase the bias voltage over the surface of wafer 206, while slightly decreasing the bias voltage over the surface of the top electrode 200.

Figure 5:
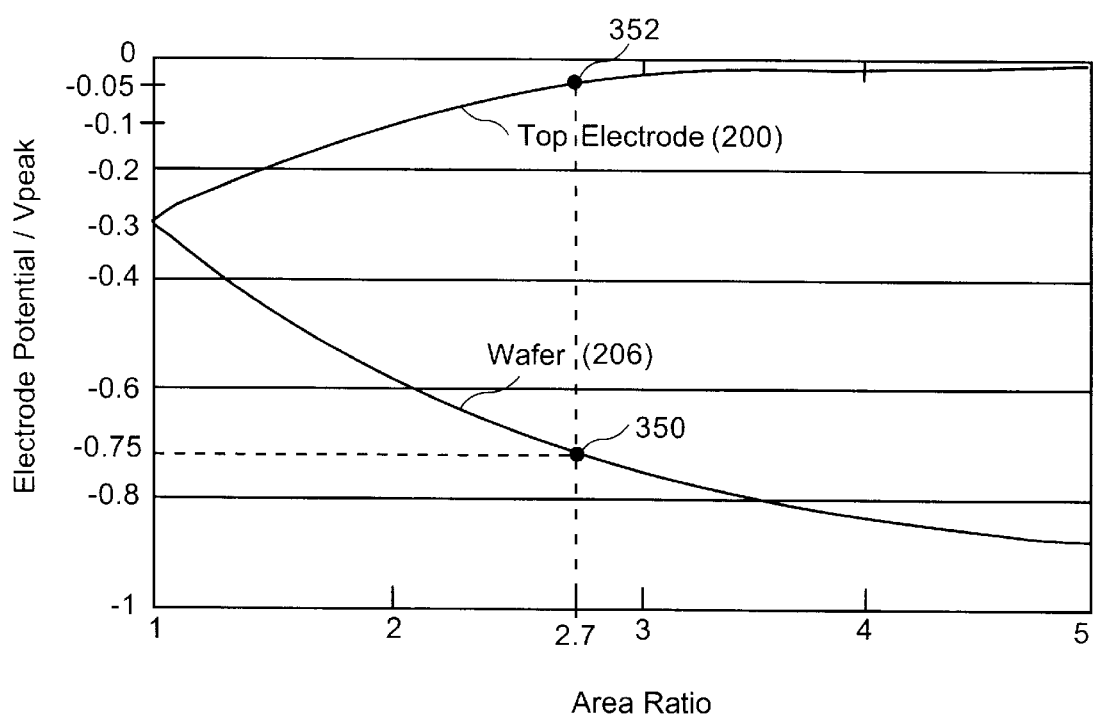
FIG. 5 is a graph illustrating bias vs. area ratio for the plasma sheaths of a top electrode and a wafer in accordance with one embodiment of the present invention.

FIG. 5 shows a graph illustrating bias vs. area ratio for the plasma sheaths of the top electrode 200 and the wafer 206, assuming that a sinusoidal RF potential is used and proper current balancing is in effect, in accordance with one embodiment of the present invention. When the sheath areas of the top electrode 200 and wafer 206 are about the same, the bias voltage (i.e., Electrode Potential/Vpeak) on both the top electrode 200 and wafer 206 will be about −0.3. However, the bias voltage of the top electrode 200 is shown to decrease as the area ratio increases. Conversely, the bias of the wafer 206 is shown to increase as the area ratio increases.

In a preferred embodiment, when the plasma sheath 231 has an area$_1$ that is about 2.7 times greater than the area$_2$ of the plasma sheath 232, the bias voltage on the wafer 206 will increase to about −0.75, while the bias voltage on the top electrode 200 will decrease to about −0.05. Because the bias voltage is now greater on the surface of the wafer 206, a larger ion bombardment energy will be present on the surface of the wafer 206 to assist in high aspect ratio semiconductor etching operations.

As an advantage, it is now possible to increase the bias voltage over the surface of the wafer 206 without causing an increase in plasma density. As mentioned above, when the plasma density is caused to increase beyond an acceptable level, the processing gases may fail to perform their desired etching functions. Further yet, because an increased bias voltage is essentially an increase in ion bombardment energy, higher aspect ratio geometries can now be etched without causing premature etch stops, bow etch effects, or process window shifts.

In addition, although the above described parameters are associated with chambers configured to process "8 inch wafers," the parameters may be modified for application to substrates of varying sizes and shapes, such as those employed in the manufacture of semiconductor devices and flat panel displays. While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a system for processing a semiconductor wafer through plasma etching operations, the system including a process chamber having a support chuck for holding the semiconductor wafer and a pair of RF power sources; the system comprising:

an electrode being positioned within the system and over the semiconductor wafer, the electrode having a center region, a first surface and a second surface, the first surface is configured to receive processing gases from a source that is external to the system and flow the processing gases into the center region, the second surface has a plurality of gas feed holes that are continuously coupled to a corresponding plurality of electrode openings that have electrode opening diameters that are greater than gas feed hole diameters of the plurality of gas feed holes, the plurality of electrode openings are configured to define the second surface which is located over a wafer surface of the semiconductor wafer, the second surface having a larger surface area than the wafer surface of the semiconductor wafer, whereby the second surface is configured to induce an increased bias voltage over the semiconductor wafer and a decreased bias voltage to the second surface of the electrode.

2. The system for processing a semiconductor wafer through plasma etching operations as recited in claim 1, wherein the electrode is coupled to one of the pair of RF power sources and the support chuck is coupled to the other one of the pair of RF power sources.

3. The system for processing a semiconductor wafer through plasma etching operations as recited in claim 2, wherein a plasma is defined between the second surface of the electrode and the wafer surface.

4. The system for processing a semiconductor wafer through plasma etching operations as recited in claim 3, wherein a first plasma sheath is defined next to the wafer surface and a second plasma sheath is defined next to the second surface, and the second plasma sheath follows an outline defined by the electrode openings of the second surface of the electrode.

5. The system for processing a semiconductor wafer through plasma etching operations as recited in claim 4, wherein the first plasma sheath has a first area and the second plasma sheath has a second area, and the second area of the second plasma sheath is larger than the first area of the first plasma sheath.

6. The system for processing a semiconductor wafer through plasma etching operations as recited in claim 1, wherein the electrode openings are at least about 0.5 mm or greater in diameter and the gas feed holes have a diameter of about 0.1 mm.

7. The system for processing a semiconductor wafer through plasma etching operations as recited in claim 6, wherein a separation of between about 0.75 cm and about 4 cm is defined between the electrode surface and the wafer surface.

8. The system for processing a semiconductor wafer through plasma etching operations as recited in claim 1, wherein two or more gas buffer plates are contained within the center region of the electrode.

9. The system for processing a semiconductor wafer through plasma etching operations as recited in claim 1, wherein the electrode openings are defined in a hexagonal pattern arrangement throughout the second surface of the electrode.

10. The system for processing a semiconductor wafer through plasma etching operations as recited in claim 5, wherein the second area of the second plasma sheath is between about 2 and 3 times greater than the first area of the first plasma.

11. The system for processing a semiconductor wafer through plasma etching operations as recited in claim 10, wherein the second area of the second plasma sheath is about 2.7 times greater than the first area of the first plasma sheath.

12. The system for processing a semiconductor wafer through plasma etching operations as recited in claim 1, wherein the increase in bias voltage causes an increase in ion bombardment energy onto the wafer surface, thereby increasing etch control.

13. In a system for processing a semiconductor wafer through plasma etching operations, the system including a process chamber having a support chuck for supporting the semiconductor wafer and having a RF power source connected thereto; the system comprising:

a grounded electrode being positioned within the system and over the semiconductor wafer, the grounded electrode having a center region, a first surface and a second surface, the first surface is configured to receive processing gases from a source that is external to the system and flow the processing gases into the center region, the second surface has a plurality of gas feed holes that are continuously coupled to a corresponding plurality or electrode openings that have electrode opening diameters that are greater than gas feed hole diameters of the plurality of gas feed holes, the plurality of electrode openings are configured to define the second surface which is located over a wafer surface of the semiconductor wafer, the second surface having a larger surface area than the wafer surface of the semiconductor wafer, whereby the second surface is configured to induce an increased bias voltage over the semiconductor wafer and a decreased bias voltage to the second surface of the electrode.

14. The system for processing a semiconductor wafer through plasma etching operations as recited in claim 13, wherein a plasma is defined between the second surface of the electrode and the wafer surface.

15. The system for processing a semiconductor wafer through plasma etching operations as recited in claim 14, wherein a first plasma sheath is defined next to the wafer surface and a second plasma sheath is defined next to the second surface, and the second plasma sheath follows an outline defined by the electrode openings of the second surface of the electrode.

16. The system for processing a semiconductor wafer through plasma etching operations as recited in claim 15, wherein the first plasma sheath has a first area and the second plasma sheath has a second area, and the second area of the second plasma sheath is larger than the first area of the first plasma sheath.

17. The system for processing a semiconductor wafer through plasma etching operations as recited in claim 13, wherein the electrode openings are at least about 0.5 mm or greater in diameter and the gas feed holes have a diameter of about 0.1 mm.

18. The system for processing a semiconductor wafer through plasma etching operations as recited in claim 16, wherein when the second area of the second plasma sheath is greater than the first area of the first plasma sheath, an increase in bias voltage is applied to the wafer surface and a decrease in bias voltage is applied to the second surface of the electrode.

19. In a system for processing a semiconductor wafer through plasma etching operations, the system including a process chamber having a support chuck for holding the semiconductor wafer and a pair of RF power sources; the system comprising:

an electrode being positioned within the system and over the semiconductor wafer, the electrode having a center region, a first surface and a second surface, the first surface is configured to receive processing gases from a source that is external to the system and flow the processing gases into the center region, the second surface has a plurality of gas feed holes that are continuously coupled to a corresponding plurality of electrode openings that have electrode opening diameters at least equal to or greater than 0.5 mm and are greater than gas feed hole diameters of the plurality of gas feed holes, the plurality of electrode openings are configured to partially define the second surface that has a surface area that is larger than a wafer surface of the semiconductor wafer, whereby the second surface is configured to induce an increased bias voltage over the semiconductor wafer and a decreased bias voltage to the second surface of the electrode, the increased bias voltage causing an increased ion bombardment over the wafer during the plasma etching operations.

* * * * *